United States Patent
Kim et al.

(10) Patent No.: US 9,424,954 B2
(45) Date of Patent: Aug. 23, 2016

(54) SEMICONDUCTOR PACKAGE INCLUDING STACKED CHIPS AND METHOD OF FABRICATING THE SAME

(71) Applicant: Samsung Electronics Co., Ltd., Suwon-Si, Gyeonggi-Do (KR)

(72) Inventors: Taek-Sung Kim, Yongin-si (KR); Sangbo Lee, Yongin-si (KR); SoonYong Hur, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/150,092

(22) Filed: Jan. 8, 2014

(65) Prior Publication Data
US 2014/0347943 A1    Nov. 27, 2014

(30) Foreign Application Priority Data

May 23, 2013   (KR) ................ 10-2013-0058466

(51) Int. Cl.
*G11C 7/00*       (2006.01)
*G11C 29/00*      (2006.01)

(52) U.S. Cl.
CPC ........... *G11C 29/886* (2013.01); *G11C 29/006* (2013.01); *G11C 2229/746* (2013.01); *H01L 2224/16145* (2013.01)

(58) Field of Classification Search
USPC ........................................................ 365/200
See application file for complete search history.

(56) References Cited

U.S. PATENT DOCUMENTS

| | | | |
|---|---|---|---|
| 5,633,173 A | 5/1997 | Bae | |
| 5,668,400 A | 9/1997 | Quinn | |
| 6,214,630 B1 | 4/2001 | Hsuan et al. | |
| 6,426,904 B2 | 7/2002 | Barth et al. | |
| 6,704,228 B2 | 3/2004 | Jang et al. | |
| 6,744,691 B2 | 6/2004 | Tsujino | |
| 6,785,143 B2 | 8/2004 | Nakaoka | |
| 7,381,986 B2 | 6/2008 | Keller et al. | |
| 7,435,990 B2 | 10/2008 | Keller et al. | |
| 7,694,246 B2 | 4/2010 | Miller et al. | |
| 7,754,532 B2 | 7/2010 | Farrar | |
| 2003/0123301 A1 | 7/2003 | Jang et al. | |

(Continued)

FOREIGN PATENT DOCUMENTS

| | | | |
|---|---|---|---|
| JP | H10-116232 A | 5/1998 | |
| JP | H10-116958 A | 5/1998 | |

(Continued)

*Primary Examiner* — Hoai V Ho
*Assistant Examiner* — Pablo Huerta
(74) *Attorney, Agent, or Firm* — Harness, Dickey & Pierce, P.L.C.

(57) ABSTRACT

A semiconductor package includes first and second slave chips stacked vertically; and a master chip connected to the first and second slave chips, each of the slave chips including, a plurality of memory blocks, and a redundancy block, and the master chip including, a fuse block configured to repair a defective memory block detected from the first slave chip and a defective memory block detected from the second slave chip by using the redundancy block of the first slave chip and the redundancy block of the second slave chip, respectively, and a block selection circuit configured to, connect the redundancy blocks of the first and second slave chips, one or more non-defective ones of the plurality of memory blocks of the first slave chip, and one or more non-defective ones of the plurality of memory blocks of the second slave chip to an input/output circuit.

8 Claims, 19 Drawing Sheets

(56) References Cited

U.S. PATENT DOCUMENTS

| | | |
|---|---|---|
| 2003/0213988 A1 | 11/2003 | Tsujino |
| 2003/0237061 A1 | 12/2003 | Miller et al. |
| 2004/0017664 A1 | 1/2004 | Nakaoka |
| 2004/0135231 A1 | 7/2004 | Keller et al. |
| 2006/0284174 A1 | 12/2006 | Keller et al. |
| 2008/0096320 A1 | 4/2008 | Farrar |
| 2009/0130821 A1 | 5/2009 | Cox et al. |
| 2012/0195137 A1* | 8/2012 | Yun ................ G11C 29/883 365/189.07 |
| 2013/0070547 A1* | 3/2013 | Pyeon ................ G11C 29/44 365/200 |
| 2013/0210170 A1* | 8/2013 | Chou ................ G11C 29/24 438/4 |

FOREIGN PATENT DOCUMENTS

| | | |
|---|---|---|
| JP | 2002-313915 A | 10/2002 |
| JP | 2007-335785 A | 12/2007 |
| JP | 2010-040133 A | 2/2010 |
| KR | 2005-0072166 A | 7/2005 |

* cited by examiner

SEMICONDUCTOR PACKAGE INCLUDING STACKED CHIPS AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2013-0058466, filed on May 23, 2013, the entire contents of which are hereby incorporated by reference.

BACKGROUND

At least some example embodiments of the inventive concepts herein relate to a semiconductor package and/or a method of fabricating the same. At least some example embodiments of the inventive concepts relate, more particularly, to a semiconductor package capable of repairing stacked chips and/or a method of fabricating the same.

Trends in today's electronics industries are to fabricate lightweight, miniaturized, high speed, multi-functional, and high performance products at a reasonable price. In order to meet the trends, a multi-chip stacked package technique or a system in package technique is used. The multi-chip stacked package technique and the system in package technique uses a through silicon via.

In relation to a multi-chip stacked package or a system in package, one semiconductor package may perform functions of a plurality of unit semiconductor devices. The multi-chip stacked package or the system in package may be somewhat thicker than a typical single chip package, but may have a similar size to a single chip package in terms of a plane. Therefore, they are mainly used for products having high-level functions and requiring miniaturization and portability such as a mobile phone, a notebook computer, a memory card, and a portable camcorder.

SUMMARY

At least some embodiments of the inventive concepts provide a semiconductor package capable of repairing stacked semiconductor chips.

At least some embodiments of the inventive concepts also provide a method of fabricating a semiconductor package capable of repairing stacked semiconductor chips.

At least some embodiments of the inventive concepts provide semiconductor packages including: first and second slave chips stacked vertically; and a master chip connected to the first and second slave chips, each of the first and second slave chips including, a plurality of memory blocks, and a redundancy block, and the master chip including, a fuse block configured to repair a defective memory block detected from the first slave chip and a defective memory block detected from the second slave chip by using the redundancy block of the first slave chip and the redundancy block of the second slave chip, respectively, and a block selection circuit configured to, connect the redundancy block of the first slave chip, the redundancy block of the second slave chip, one or more non-defective ones of the plurality of memory blocks of the first slave chip, and one or more non-defective ones of the plurality of memory blocks of the second slave chip to an input/output circuit.

In some embodiments, the fuse block may include: a first fuse box outputting a first fuse signal having address information on the defective memory block of the first slave chip; and a second fuse box outputting a second fuse signal having address information on the defective memory block of the second slave chip.

In other embodiments, the block selection circuit may include: a first block selection unit connecting the memory blocks except the defective memory block and the redundancy block of the first slave chip into the input/output circuit in response to the first fuse signal; and a second block selection unit connecting the memory blocks except the defective memory block and the redundancy block of the second slave chip into the input/output circuit in response to the second fuse signal.

In still other embodiments, the fuse block may cut off power supply to the defective memory block of each of the first and second memory blocks.

In even other embodiments, the block selection circuit may be connected to input/output lines of the memory blocks and the redundancy block of the first and second slave chips via through silicon via.

In yet other embodiments, the plurality of memory blocks may be disposed around the redundancy block in each of the first and second semiconductor chips.

In further embodiments, a normal memory block of the second slave chip may be stacked on the defective memory block of the first slave chip, so that the normal memory block of the second slave chip may be connected to the defective memory block of the first slave chip.

In still further embodiments, the memory blocks may be electrically separated from each other in the first and second slave chips.

In other embodiments of the inventive concepts, provided are methods of fabricating a semiconductor package, the methods include: preparing a plurality of first semiconductor chips, each including a plurality of memory blocks and a redundancy block; stacking the plurality of first semiconductor chips on a second semiconductor chip including an input/output circuit; performing a test process on the stacked first semiconductor chips to detect one or more defective memory blocks from among the plurality of memory blocks of the first semiconductor chips; for each of one or more of the plurality of first semiconductor chips in which one of the one or more defective memory blocks is found, repairing the defective memory block with the redundancy block of the first semiconductor chip; and connecting one or more non-defective ones of the plurality of memory blocks of the first semiconductor chip and the redundancy block of the first semiconductor chip to the input/output circuit according to detection information of the defective memory blocks.

In some embodiments, the second semiconductor chip may include: a fuse block repairing the defective memory block with the redundancy block and outputting a fuse signal having address information on the defective memory blocks in each of the stacked first semiconductor chips; and a block selection circuit connecting the memory blocks except the defective memory block and the redundancy block into the input/output circuit in response to the fuse signal.

In other embodiments, the memory blocks and the redundancy block may include a plurality of through silicon vias and the second semiconductor chip may be connected to the first semiconductor chips via the plurality of through silicon vias.

In still other embodiments, the memory blocks may be electrically separated from each other to be independently operated; and the repairing of the defective memory block with the redundancy block may include cutting off power supply to the defective memory block.

In even other embodiments, the plurality of memory blocks may be disposed around the redundancy block in each of the first semiconductor chips.

In yet other embodiments, the stacking of the first semiconductor chips may include: preparing wafers where the plurality of first semiconductor chips are formed; and bonding the wafers each other.

In further embodiments, the methods may further include: after the repairing of the defective memory block with the redundancy block, dicing the bonded wafers into a plurality of stack semiconductor chips including the stacked first and second semiconductor chips; and packaging each of the stack semiconductor chips.

In at least some embodiments, a semiconductor package may include a plurality of slave chips stacked vertically, each of the plurality of slave chips including, a plurality of first memory units, and a redundancy memory unit; and a master chip, the master chip including, a memory unit selection circuit, the memory unit selection circuit being configured to, for each slave chip having a defective memory unit, from among the plurality of slave chips, receive a fuse signal indicating an address of the defective memory unit, connect the redundancy memory unit of the slave chip having the defective memory unit to an input/output circuit, based on the indicated address, and connect each of one or more non-defective ones of the plurality of first memory units of the slave chip to the input/output circuit.

In at least some embodiments, the master chip further includes a fuse block configured to send the fuse signal to the memory unit selection circuit.

In at least some embodiments, the plurality of slave chips include a plurality of fuse blocks, respectively, the plurality of fuse blocks being configured such that the fuse signal is received from one of the plurality of fuse blocks.

In at least some embodiments, for each slave chip of the plurality of slave chips, the plurality of memory units and redundancy unit included in the slave chip are each memory dies.

In at least some embodiments, the plurality of slave chips is a plurality of memory dies, respectively, and for each memory die of the plurality of memory dies, the plurality of memory units included in the memory die are each memory blocks.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
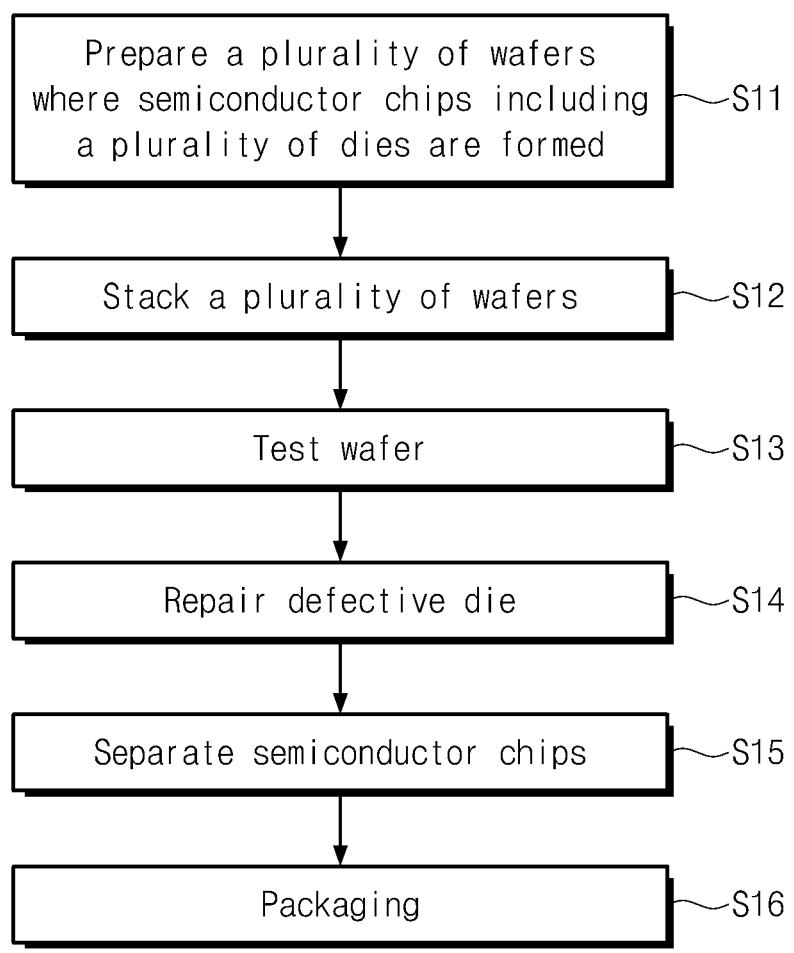
FIG. 1 is a flowchart illustrating a method of fabricating a semiconductor package according to an embodiment of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, at least some embodiments of the inventive concepts will be described in detail with reference to the accompanying drawings.

Figure 2:
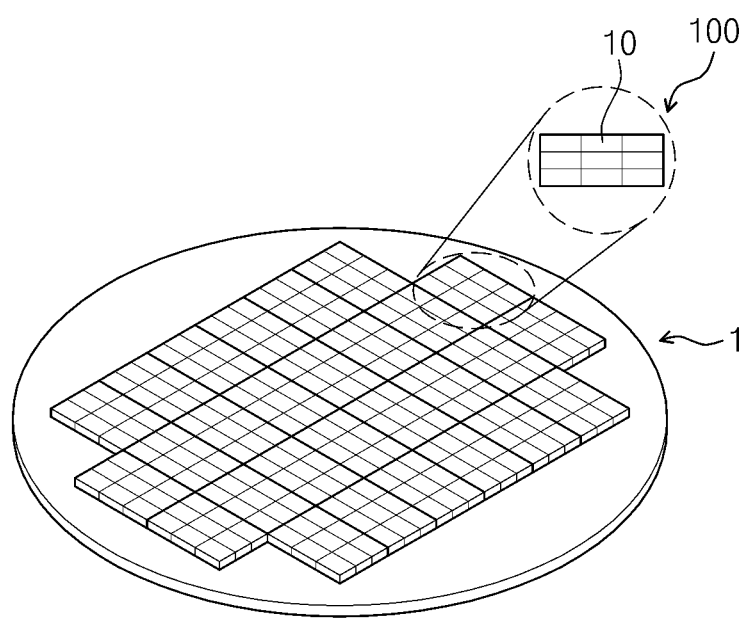
FIG. 2 is a plan view illustrating a semiconductor wafer according to an embodiment of the inventive concepts.
Figure 3:
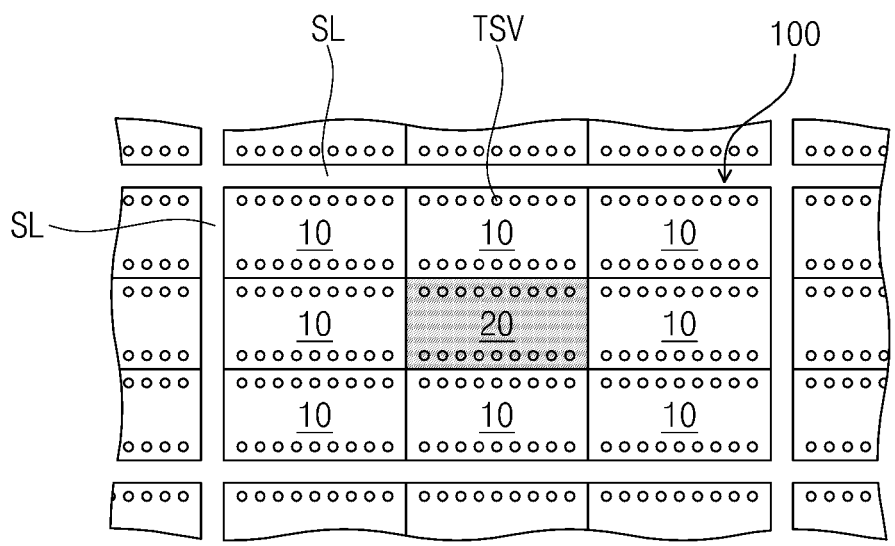
FIG. 3 is a plan view illustrating a semiconductor chip formed on a semiconductor wafer according to an embodiment of the inventive concepts.
Figure 4:
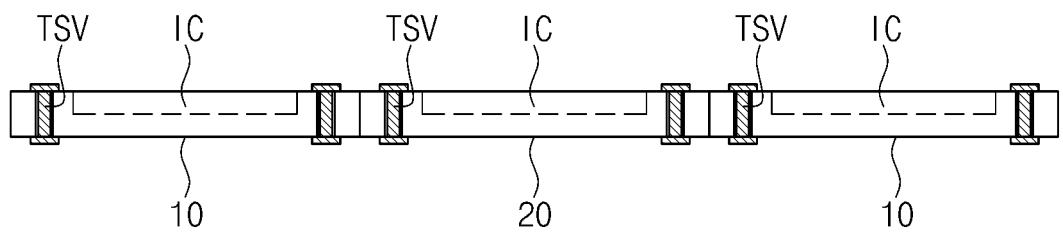
FIG. 4 is a sectional view illustrating a semiconductor chip formed on a semiconductor wafer according to an embodiment of the inventive concepts.
Figure 5:
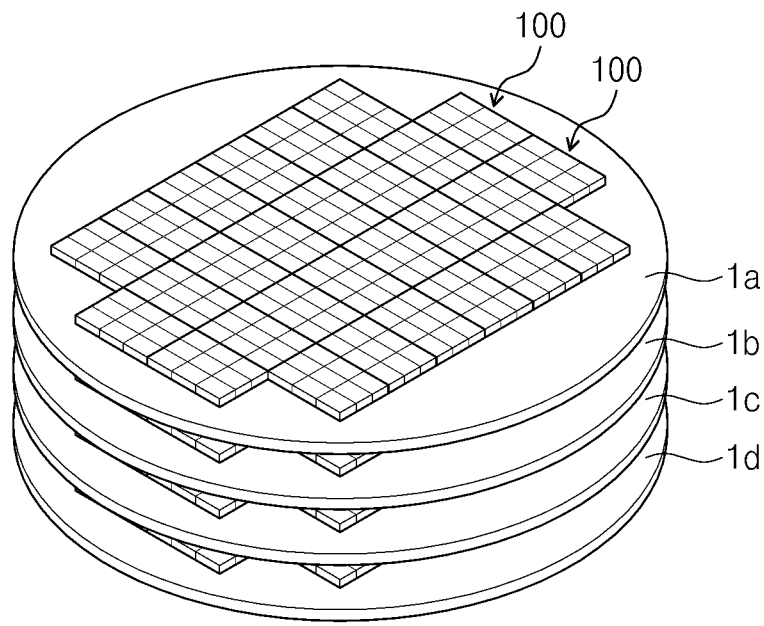
FIGS. 5 to 7 are perspective views illustrating a method of fabricating a semiconductor package according to an embodiment of the inventive concepts.
Figure 6:
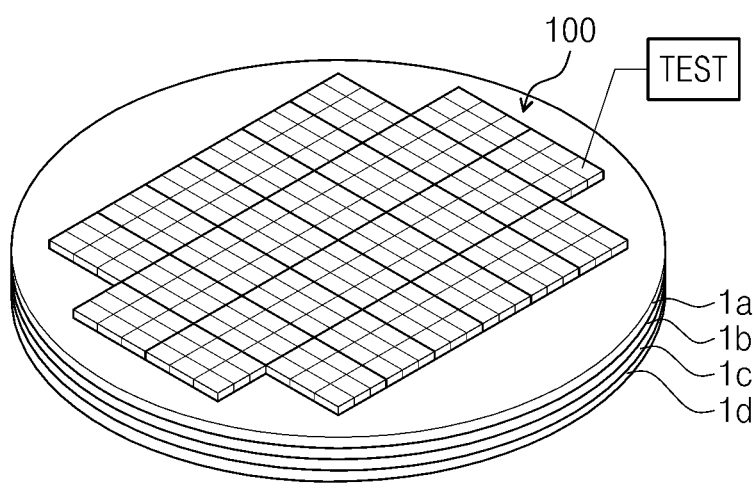
Figure 7:
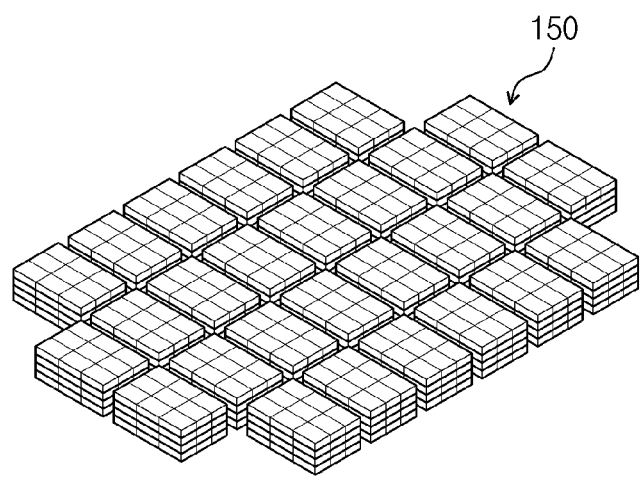
Figure 8:
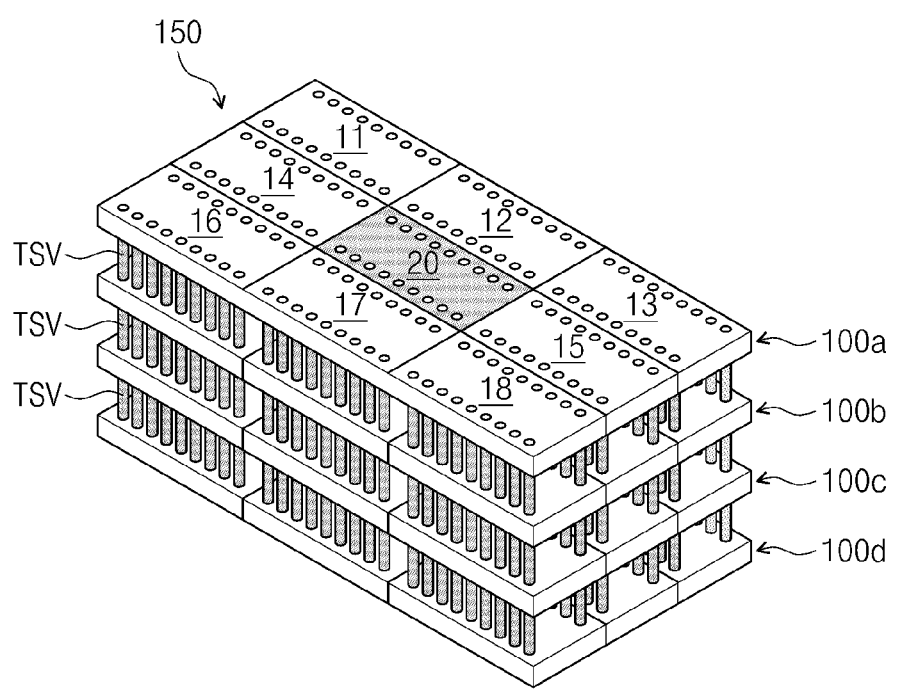
FIG. 8 is a sectional view illustrating a semiconductor package formed through a method of fabricating a semiconductor package according to an embodiment of the inventive concepts.

FIG. 1 is a flowchart illustrating a method of fabricating a semiconductor package according to an embodiment of the inventive concepts. FIG. 2 is a plan view illustrating a semiconductor wafer according to an embodiment of the inventive concepts. FIG. 3 is a plan view illustrating a semiconductor chip formed on a semiconductor wafer according to an embodiment of the inventive concepts. FIG. 4 is a sectional view illustrating a semiconductor chip formed on a semiconductor wafer according to an embodiment of the inventive concepts. FIGS. 5 to 7 are perspective views illustrating a method of fabricating a semiconductor package according to an embodiment of the inventive concepts. FIG. 8 is a sectional view illustrating a semiconductor package formed through a method of fabricating a semiconductor package according to an embodiment of the inventive concepts.

Referring to FIGS. 1 and 2, a plurality of semiconductor wafers 1 including semiconductor chips 100 formed thereon are prepared in step S11. The semiconductor chips 100 may be two-dimensionally arranged on the top surface of the semiconductor wafer 1. In an embodiment, each of the semiconductor chips 100 may be configured with a plurality of dies 10. According to embodiments, one die 10 may be a semiconductor device including a data input/output buffer and a memory cell array to operate separately. That is, the plurality of dies 10 configuring one semiconductor chip 100 may be electrically separated from each other. In an embodiment, one semiconductor chip 100 may be configured with nine dies 10, and one of the dies 10 may be a redundancy die repaired when a defective die occurs. In an embodiment, although one semiconductor chip 100 including nine dies 10 is described exemplarily, the inventive concepts are not limited thereto.

Referring to FIGS. 3 and 4, a redundancy die 20 is disposed at the center of the semiconductor chip 100, and dies 10 are disposed around the redundancy die 20. In such a way, as the redundancy die 20 is disposed at the center of the semiconductor chip 100, it may be adjacent to all the dies 10. The plurality of dies 10 and the redundancy die 20 may be formed through the same semiconductor fabricating process. Also, the semiconductor wafer 1 may have a scribe line (SL) between the semiconductor chips 100.

In an embodiment, each of the dies 10 and the redundancy die 20 may be a semiconductor device including a data input/output buffer and a memory cell array to operate separately. Accordingly, each of the dies 10 and the redundancy die 20 may include a memory cell array, cell array driving circuits (i.e., column and row address decoders), input/output circuits (i.e., a sense amp and an input/output register), and a control circuit (i.e., a command decoder, and a mode register set). In more detail, each of the dies 10 and the redundancy die 20 may include one or more integrated circuits ICs formed on a semiconductor substrate (e.g., a silicon substrate) and through electrons TSV penetrating a semiconductor substrate to electrically connect to the outside. Integrated circuits ICs may include a memory device, a core circuit device, a peripheral circuit device, a logic circuit device, or a control circuit device. For example, the ICs may include semiconductor memory devices such as dynamic random access memory (DRAM), static random access memory (SRAM), and flash memory.

The through silicon via TSV may be disposed spaced apart from the ICs, and may be electrically connected to the ICs through a conductive pad (not shown). In an embodiment, the through silicon via TSV may be disposed at the edge of each of the dies 10 and the redundancy die 20, or may be arranged at the center portion of each of the dies 10 and the redundancy die 20. Moreover, the through silicon via TSV penetrating a semiconductor substrate may be surrounded by an insulating layer.

Furthermore, each of the dies 10 and the redundancy die 20 may include an e-fuse performing a program operation to be capable of repairing defects through an electrical method when defects occur. According to an embodiment, the e-fuse may be connected to a power terminal provided to each of the dies 10 and the redundancy die 20. Accordingly, by cutting the e-fuse of a defective die detected during a test process on the semiconductor chip 100, power supply to the defective die is cut off, and power is supplied to the redundancy die 20.

Referring to FIGS. 1 and 5, a plurality of semiconductor wafers 1a, 1b, 1c, and 1d including the semiconductor chip 100 formed thereon may be stacked in step S12. The first to fourth semiconductor wafers 1a, 1b, 1c, and 1d may be bonded using an adhesive layer. The adhesive layer may include an insulating adhesive material such as epoxy resin or silicon resin. As the first to fourth semiconductor wafers 1a, 1b, 1c, and 1d are bonded, the through silicon via TSV of FIG. 3 and FIG. 4 formed in the dies 10 of FIG. 3 and the redundancy die 20 of FIG. 20 may be connected to each other. For example, the through silicon via TSV of FIG. 3 and FIG. 4 may directly contact each other or may be electrically connected to each other by using a solder bump. According to an embodiment, since the first to fourth semiconductor wafers 1a, 1b, 1c, and 1d are stacked before a wafer test process, a defective die and a normal die may be stacked vertically. That is, as a defective die of the first semiconductor wafer 1a is adjacent vertical to a normal die of the second semiconductor wafer 1b, they may be electrically connected to each other through the through silicon via TSV of FIG. 3 and FIG. 4.

Figure 11:
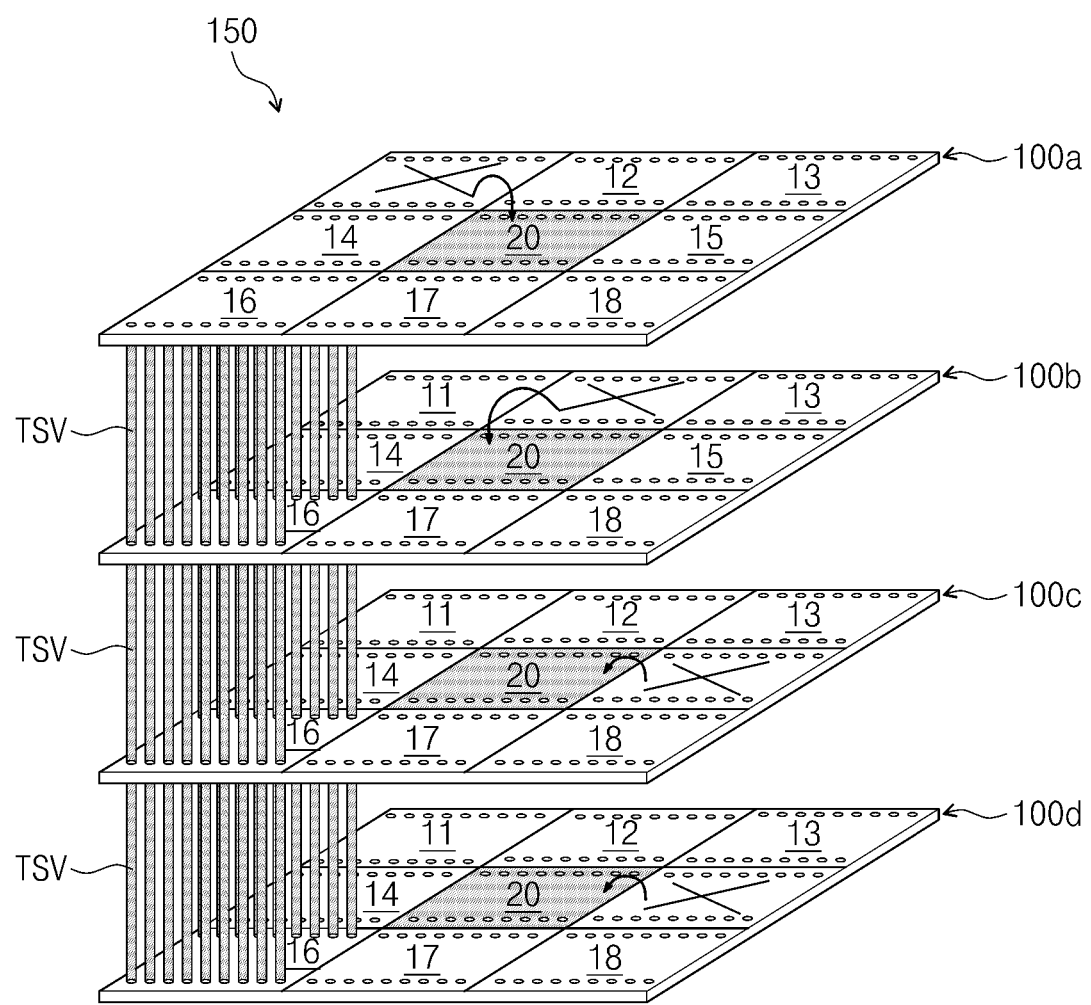
FIG. 11 is a view illustrating a method of repairing a semiconductor package according to an embodiment of the inventive concepts.

Referring to FIGS. 1 and 6, a test process may be performed on the stacked first to fourth semiconductor wafers 1a, 1b, 1c, and 1d in step S13. In an embodiment, the test process on the first to fourth semiconductor wafers 1a, 1b, 1c, and 1d may be performed through the through silicon via TSV of FIG. 3 and FIG. 4 of the semiconductor chips 100 of FIG. 3. The test process may be performed through the through silicon via TSV of FIG. 3 and FIG. 4 exposed to the dies 10 of FIG. 3 of the fourth semiconductor wafer 1d positioned at the uppermost layer. According to another embodiment, the test process may be performed on each of the first to fourth semiconductor wafers 1a, 1b, 1c, and 1d before bonding the first to fourth semiconductor wafers 1a, 1b, 1c, and 1d. In a plan view, positions of defective dies detected from the first to fourth semiconductor wafers 1a, 1b, 1c, and 1d may vary as shown in FIG. 11.

Also, referring to FIG. 1, after the test process, the defective die is repaired in step S14. That is, a defective die in each of the semiconductor chips 100 formed on the first to fourth semiconductor wafers 1a, 1b, 1c, and 1d may be replaced with the redundancy die 20. According to an embodiment, each die 10 of FIG. 3 and FIG. 4 may include an e-fuse connected to a power terminal, and by cutting the e-fuse in a defective die detected from the test process to cut off power supply to the defective die, power may be supplied to a redundancy die. A method of repairing a defective die will be described in more detail with reference to FIG. 11. According to embodiments, since a defective die is repaired on each of the semiconductor wafers 1a, 1b, 1c, and 1d after they are stacked, a manufacturing yield of a semiconductor device may be improved.

Referring to FIGS. 1 and 7, the bonded semiconductor wafers 1a, 1b, 1c, and 1d is cut to be separately divided into the stack semiconductor chips 150 in step S15. For example, a sawing process is performed on the scribe line of the semiconductor wafers 1a, 1b, 1c, and 1d so as to separately divide the stack semiconductor chips 150. Here, the sawing process may use a sawing wheel or laser. Each of the divided stack semiconductor chips 150 includes the plurality of stacked semiconductor chips 100 of FIG. 3.

FIG. 8 is a perspective view illustrating a stack semiconductor chip formed through a method of fabricating a semiconductor package according to an embodiment of the inventive concepts.

Referring to FIG. 8, the stack semiconductor chip 150 may include stacked first to fourth semiconductor chips 100a, 100b, 100c, and 100d. Each of the first to fourth semiconductor chips 100a, 100b, 100c, and 100d includes first to eighth dies 11 to 18 and a redundancy die 20.

The stacked first to fourth semiconductor chips 100a, 100b, 100c, and 100d may be electrically connected to each other via through silicon via TSV. That is, first dies 11 in the first to fourth semiconductor chips 100a, 100b, 100c, and 100d are electrically connected to each other via the through silicon via TSV. Furthermore, the first to fourth semiconductor chips 100a, 100b, 100c, and 100d may include a defective die detected as a defect during a test process, and when the first to fourth semiconductor chips 100a, 100b, 100c, and 100d are stacked, a defective die and a normal die are connected to each other vertically. That is, when the first die 11 of the fourth semiconductor chip 100d is determined as defective and the first die 11 of the third semiconductor chip 100c is determined as normal during a test process, a defective die and a normal die of the first and second semiconductor chips 100a and 100b may be connected to each other vertically.

Figure 9:
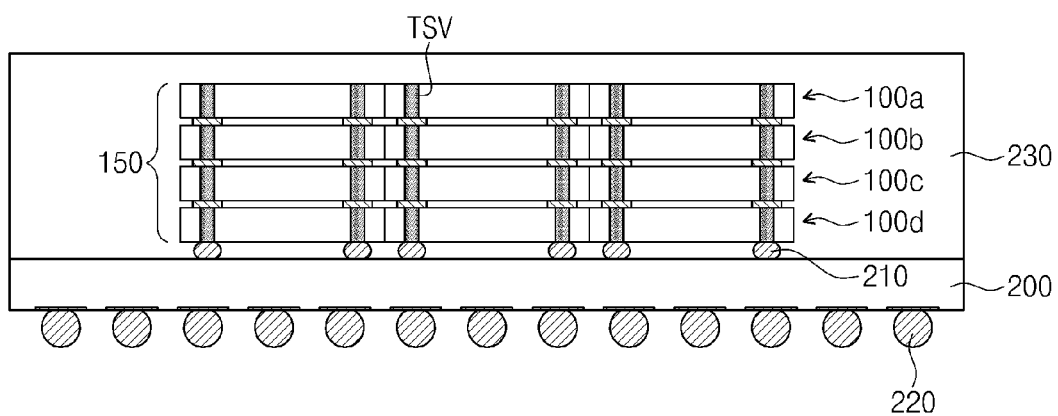
FIG. 9 is a flowchart illustrating a method of fabricating a semiconductor package according to another embodiment of the inventive concepts.

Moreover, referring to FIGS. 1 and 9, a packaging process may be performed on the stack semiconductor chip 150 including the stacked semiconductor chips 100a, 100b, 100c, and 100d in step S16. According to an embodiment, the stack semiconductor chip 150 may be mounted on a package substrate 200. The stack semiconductor chip 150 may be mounted through a flip chip bonding method.

The package substrate 200 may include various kinds of substrates including, for example, a printed circuit board, a flexible substrate, and a tape substrate. According to an embodiment, the package substrate 200 may include a flexible printed circuit board including internal wires therein, a rigid printed circuit board, and a combination thereof.

The package substrate 200 has a top surface and a bottom surface, and includes bonding pads, connection pads, and internal wires. The bonding packages are arranged on the top surface of the package substrate 200, and may be electrically connected to the stack semiconductor chip 150 through bumps 210. That is, the bonding pads on the top surface of the package substrate 200 may be connected to the through silicon via of the semiconductor chips 100a to 100d through the bump 210. The connection pads may be arranged on the bottom surface of the package substrate 200, and may be electrically connected to the bonding pads through the internal wires. Moreover, external connection terminals 220 (e.g., solder balls) connecting a semiconductor package to an external electronic device may be attached to the connection pads.

Furthermore, the stack semiconductor chip 150 mounted on the package substrate 220 may be molded by a molding layer 230. The molding layer 230 may be underfilled between the package substrate 200 and the stack semiconductor chip 150. The molding layer 230 may include an epoxy molding compound.

According to another embodiment, the stack semiconductor chip 150 including the stacked semiconductor chips 100 may be packaged in a chip scale. That is, external connection terminals 220 for connecting to an external device may be attached to the semiconductor chip 100 located at the lowermost layer among the stacked semiconductor chips 100.

Figure 10:
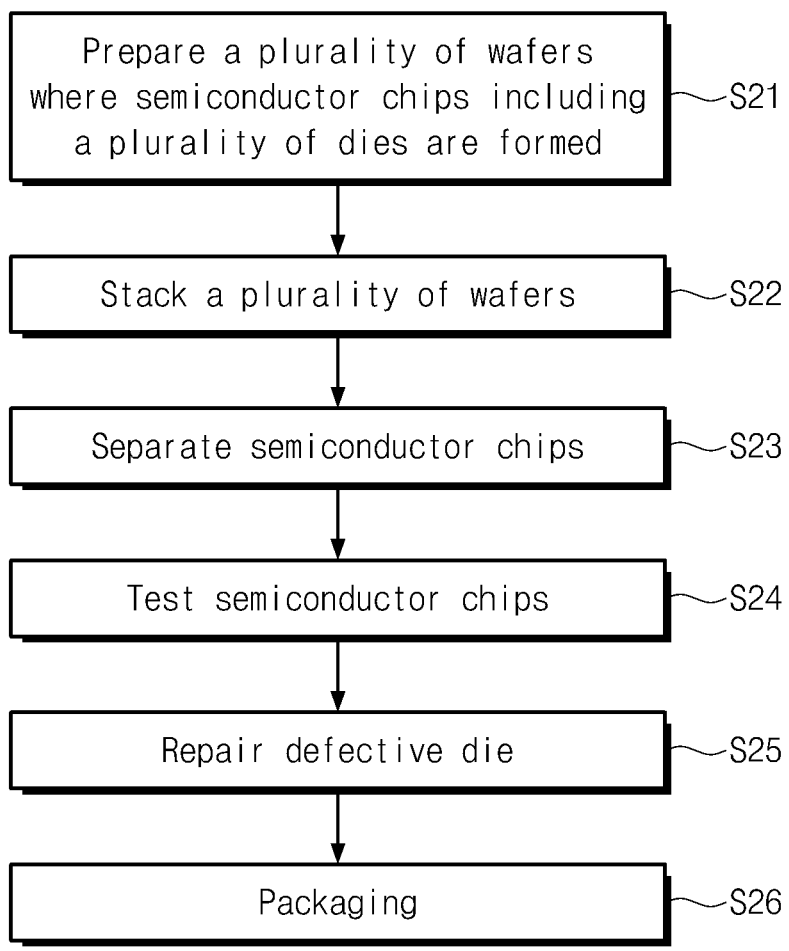
FIG. 10 is a flowchart illustrating a method of fabricating a semiconductor package according to another embodiment of the inventive concepts.

FIG. 10 is a flowchart illustrating a method of fabricating a semiconductor package according to another embodiment of the inventive concepts. According to this embodiment, a test process and a repair process on stacked semiconductor chips may be performed after a plurality of semiconductor wafers are bonded and divided into stack semiconductor chips separately.

According to the embodiment shown in FIG. 13, as described with reference to FIGS. 2, 3, and 4, a plurality of semiconductor wafers 1 including semiconductors chips formed thereon are prepared in step S21. Then, as described with reference to FIGS. 5 and 6, the plurality of semiconductor wafers 1a to 1d are stacked and bonded to each other in step S22. Then, as described with reference to FIG. 7, a sawing process is performed along the scribe line SL of the stacked semiconductor wafers 1 so that the individually separated stack semiconductor chips 150 are formed in step S23. Then, a test process may be performed on each of the stacked semiconductor chips 100 of FIG. 3 in the individually separated stack semiconductor chips 150 in step S24. After the test process, a defective die detected from each of the stacked semiconductor chips 100 of FIG. 3 is replaced with the redundancy die through the repair process in step S25. Then, as described with reference to FIG. 9, the stack semiconductor chips are packaged individually in step S26.

FIG. 11 is a view illustrating a method of repairing a semiconductor package according to an embodiment of the inventive concepts. Referring to FIG. 11, defective dies detected from a test process are indicated with X, and an operation of repairing defective dies with the redundancy die 20 in each of the semiconductor chips 100a to 100d is described with an arrow. Additionally, since defective dies are detected through a test process after the semiconductor chips 100a to 100b are stacked, positions of defective dies in each of the semiconductor chips 100a to 100d may vary, in a plan view.

Referring to FIG. 11, a test process may be performed on each of the semiconductor chips 100a to 100d. The test process may be performed via through silicon via TSV in the dies 11 to 18. For example, as shown in the drawing, when the first die is determined as defective during a test process on the first semiconductor chip 100a, the first die of the first semiconductor chip 100a may be replaced with the redundancy die 20 of the first semiconductor chip 100a. Also, when the fifth die is determined as defective during a test process on the fourth semiconductor chip 100d, the fifth die of the fourth semiconductor chip 100d may be replaced with the redundancy die 20 of the fourth semiconductor chip 100d. After defective dies of each of the semiconductor chips 100a to 100d are repaired, address information on operable dies may be different from each other in each of the semiconductor chips 100a to 100d. That is, normal dies inputting/outputting data with an external device may be different from each other in each of the semiconductor chips 100a to 100d. Therefore, according to at least some embodiments of the inventive concepts, e-fuses connected to each of the dies 11 to 18 may replace a defective die with the redundancy die 20 in each of the semiconductor chips 100a to 100d, and the e-fuses may also provide a fuse signal corresponding to address information on the defective die to a die selection circuit, so that data may be inputted/outputted to/from normal dies.

Referring to FIGS. 12 to 18, a semiconductor package according to another embodiment of the inventive concepts will be described in more detail.

Figure 12:
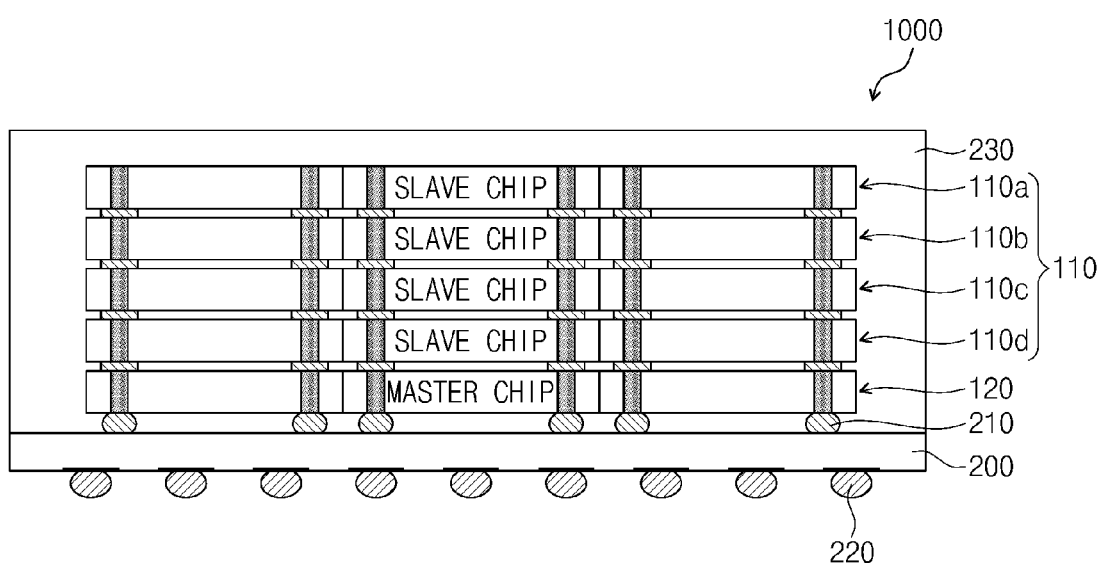
FIG. 12 is a sectional view of a semiconductor package according to another embodiment of the inventive concepts.
Figure 14:
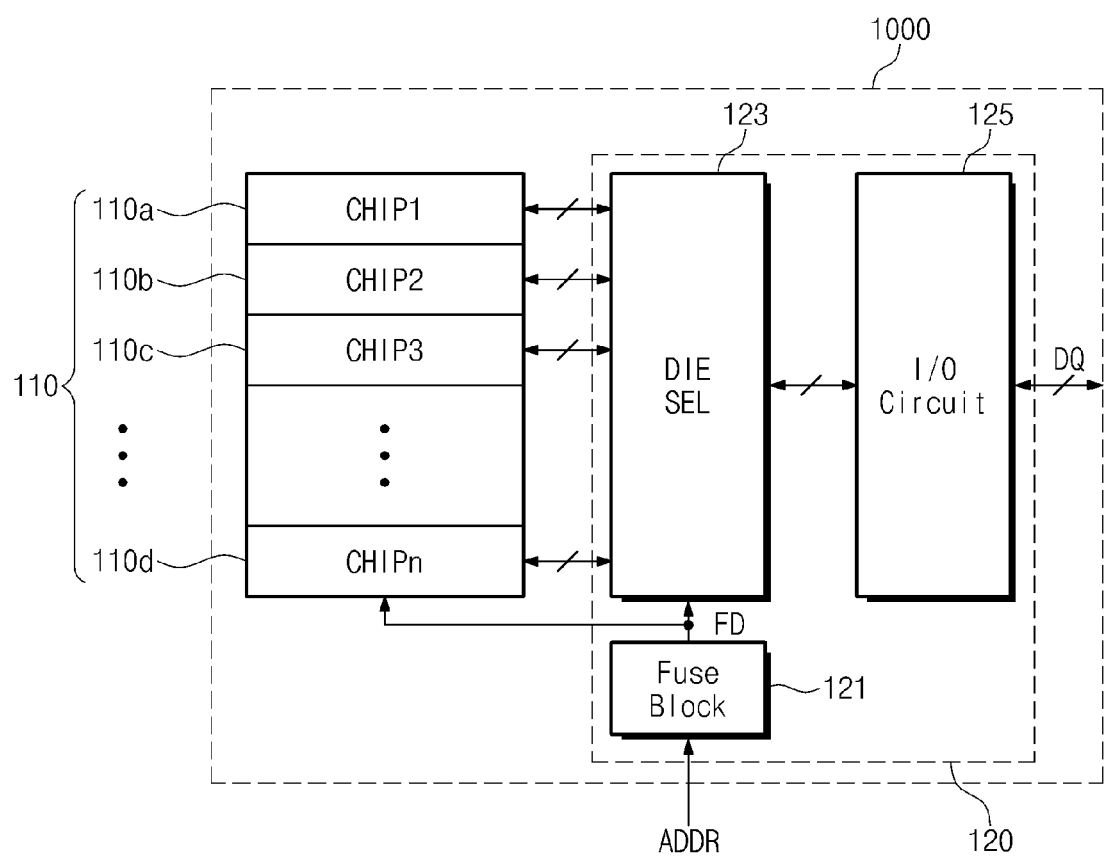
FIG. 14 is a block diagram of a semiconductor package according to another embodiment of the inventive concepts.
Figure 15:
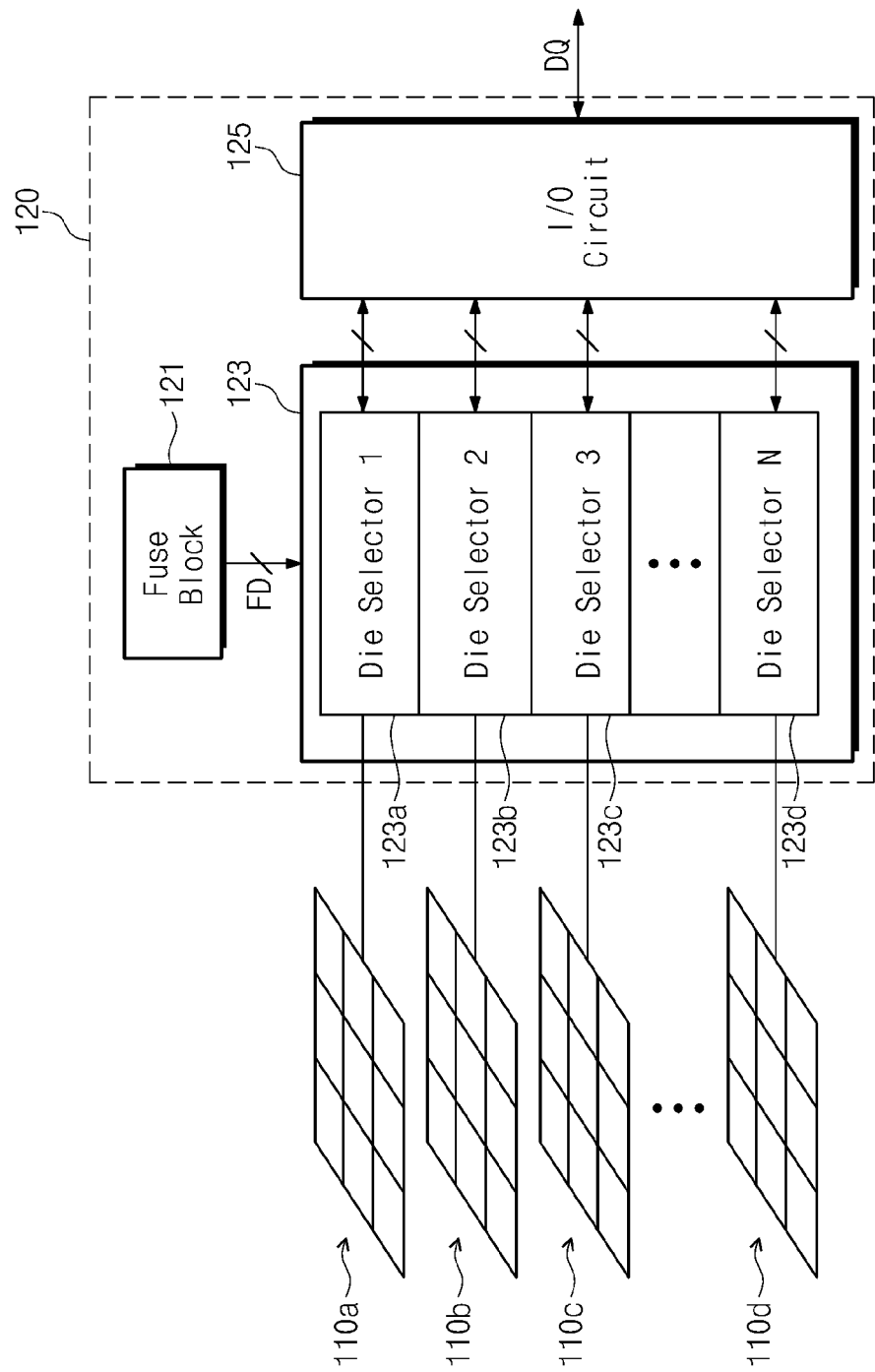
FIG. 15 is a block diagram of a master chip equipped in a semiconductor package according to another embodiment of the inventive concepts.
Figure 16:
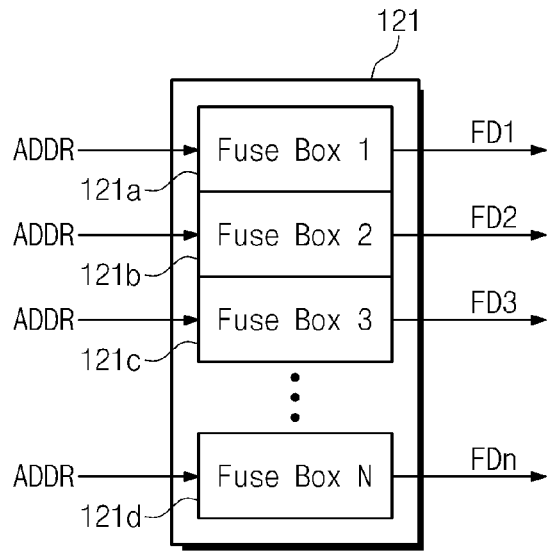
FIG. 16 is a block diagram off a fuse block shown in FIG. 15.
Figure 17:
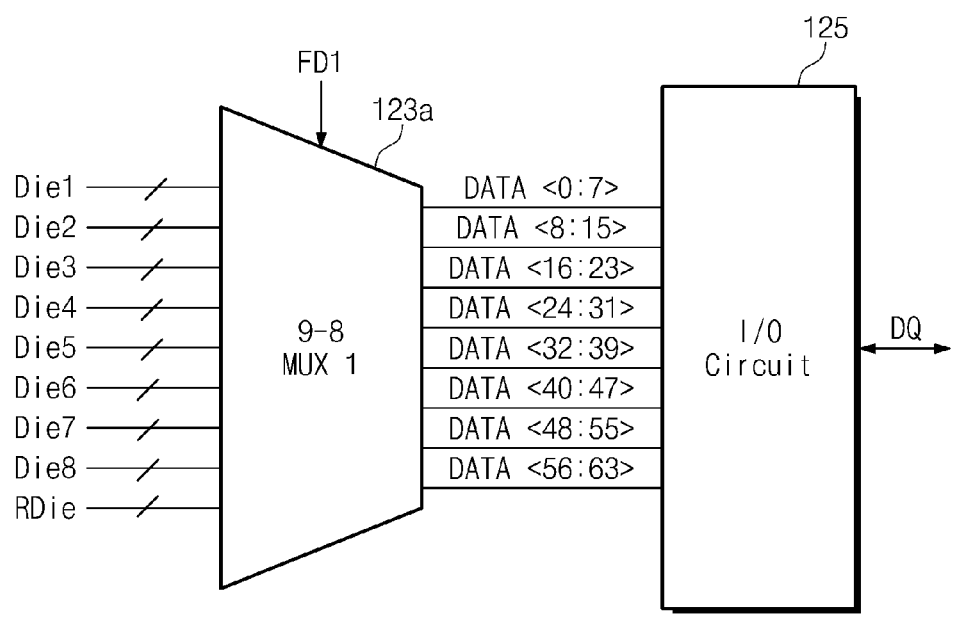
FIG. 17 is a view illustrating one of die selection units shown in FIG. 15.

FIG. 12 is a sectional view of a semiconductor package according to another embodiment of the inventive concepts. FIG. 13 is a plan view of a slave chip equipped in a semiconductor package according to another embodiment of the inventive concepts. FIG. 14 is a block diagram of a semiconductor package according to another embodiment of the inventive concepts. FIG. 15 is a block diagram of a master chip equipped in a semiconductor package according to another embodiment of the inventive concepts. FIG. 16 is a block diagram of a fuse block shown in FIG. 15. FIG. 17 is a view illustrating one of the die selection units shown in FIG. 15.

Referring to FIG. 12, the semiconductor package 1000 includes a master chip 120 having an input/output circuit and a stack semiconductor chip 110 stacked on the master chip 120.

According to an embodiment, the master chip 120 may be mounted on the package substrate 200. According to at least one example embodiment of the inventive concepts, the package substrate 200 may include one or more of various kinds of substrates including, for example, a printed circuit board, a flexible substrate, and a tape substrate. Moreover, external connection terminals 220 (e.g., solder balls) connecting a semiconductor package to an external electronic device may be attached to the bottom surface of the package substrate 200.

The master chip 120 may include a plurality of through silicon vias TSV, and may be connected to the package substrate 220 through a bump 210. Additionally, the master chip 120 may be electrically connected to the stack semiconductor chip 110 via the through silicon via TSV. In an embodiment, the master chip 120 may include a plurality of dies like the above-mentioned semiconductor chip 100 of FIG. 3. In an embodiment, although the master chip 120 packaged into the semiconductor package 1000 along with the stack semiconductor chip 110 including the stacked slave chips 110a to 110d is exemplarily described, the master chip 120 may be packaged so as to be separated from the stack semiconductor chip 110.

The stack semiconductor chip 110 may include stacked first to fourth slave chips 110a, 110b, 110c, and 110d. Each of the first to fourth slave chips 110a, 110b, 110c, and 110d may include a plurality of through silicon vias TSV and may be electrically connected to the master chip 120 via the through silicon via TSV.

According to this embodiment, like the semiconductor chip 100 described with reference to FIGS. 3 and 4, each of the first to fourth slave chips 110a, 110b, 110c, and 110d may include a plurality of dies having through silicon via TSV, and one of the plurality of dies may be a redundancy die. In more detail, referring to FIG. 13, each of the first to fourth slave chips 110a, 110b, 110c, and 110d includes first to eighth dies 11 to 18 and a redundancy die 20.

Each of the first to eighth dies 11 to 18 and the redundancy die 20 may include a memory cell array, a column decoder, a row decoder, a sense amp, a write driver, and an input/output buffer. Moreover, each of the first to eighth dies 11 to 18 and the redundancy die 20 may include a plurality of through silicon vias TSV and the first to fourth slave chips 110a to 11d may be connected to each other via the through silicon via TSV. In an embodiment, although each of the slave chips 110a, 110b, 110c, and 110d including nine dies is described exemplarily, the inventive concepts are not limited thereto. Furthermore, the redundancy die 20 may be disposed at the center of the slave chip 110, and the dies 10 may be disposed around the redundancy die 20. In such a way, as disposed at the center of the slave chip 110, the redundancy die 20 may be adjacent to all the dies 10 around it.

Such the first to fourth slave chips 110a to 110d may include one of DDR2 DRAM, DDR3 DRAM, mobile DRAM, EDP, PRAM, OneDRAM, Pseudo SRAM, LpDDR based DRAM, FRAM, graphic DRAM, and ReRAM. As another example, the first to fourth salve chips 110a to 110d may include one of NAND flash, NOR flash, OneNAND, PRAM, MRAM, and ReRAM.

Referring to FIG. 14, the semiconductor package 1000 includes a stack semiconductor chip 110 having a plurality of slave chips 110a to 110d, and a master chip 120 having a fuse block 121, a die selection circuit 123, and an input/output circuit 125.

The stack semiconductor chip 110 includes a plurality of slave chips 110a to 110d. Each of the slave chips 110a to 110d includes a plurality of dies, and the stacked slave chips 110a to 110d may be connected to the die selection circuit 123.

The fuse block 121 repairs a defective die of each of the slave chips 110 with a redundancy die in response to an address signal ADDR, and transmits a fuse signal FD, which is generated based on whether a fuse is cut off, to the die selection circuit 123.

The die selection circuit 123 connects remaining dies except a defective die in each of the slave chips 110a to 110d to the input/output circuit 125. The input/output circuit 125 inputs/outputs data from the slave chips 110a to 110d to an external device.

Referring to FIG. 15, the master chip 120 includes a fuse block 121, a die selection circuit 123, and an input/output circuit 125. Although shown in the drawing, the master chip 120 may include a plurality of dies like the slave chip 110 described with reference to FIG. 13, and may also include a memory cell array and an input/output buffer. Moreover, the master chip 120 may include a chip selection circuit (not shown) selecting the slave chips 110a to 110d.

The fuse block 121 substitutes a defective die with a redundancy die in the slave chips 110a to 110d, and transmits a fuse signal FD, which is generated based on whether a fuse is cut off, to the die selection circuit 123. Here, the fuse signal FD includes address information on a defective die of each of the slave chips 110a to 110d.

The die selection circuit 123 connects remaining dies except a defective die in each of the slave chips 110a to 110d to the input/output circuit 125 in response to the fuse signal FD. The die selection circuit 123 and the slave chips 110a to 110d may be connected to each other via through silicon via TSV.

In more detail, the die selection circuit 123 includes a first die selection unit 123a connected to the first slave chip 110a, a second die selection unit 123b connected to the second slave chip 110b, a third die selection unit 123c connected to the third slave chip 110c, and a fourth die selection unit 123d connected to the fourth slave chip 110d. Each of the first to fourth selection units 123a to 123d selects normal dies except a defective die in response to the fuse signal FD provided from the fuse block 121.

The input/output circuit 125 selects one of the first to fourth die selection units 123a to 123d so as to connect one of the first to fourth slave chips 110a to 110d to an external device.

Referring to FIG. 16, the fuse block 121 includes fuse boxes 121a to 121d corresponding to the slave chips 110a to 110d, respectively. The fuse boxes 121a to 121d receive a die address signal ADDR from the outside. The fuse boxes 121a to 121d receive the die address signal ADDR and replace defective dies of the slave chips 110a to 110d with redundancy dies. Each of the fuse boxes 121a to 121d may include a plurality of e-fuses connected to the dies of the slave chips 110a to 110d, and transmits a fuse signal FD, which is generated based on whether a fuse is cut off, to the die selection circuit 123.

The fuse boxes 121a to 121d stores addresses of defective dies detected during a test process on each of the slave chips 110a to 110d. That is, the first fuse box 121a stores an address of a defective die of the first slave chip 110a and the second fuse box 121b stores an address of a defective die of the second slave chip 110b. The third fuse box 121c stores an address of a defective die of the third slave chip 110c, and the fourth fuse box 121d stores an address of a defective die of the fourth slave chip 110d.

According to addresses stored in the fuse boxes 121a to 121d, a defective die is repaired with a redundancy die, and a fuse signal FD generated based on whether a fuse is cut off is provided to the die selection circuit 123. That is, the first fuse box 121a repairs a defective die, which is detected during a test process on the first slave chip 110a, with a redundancy die, and provides a first fuse signal FD1 to the first die selection unit 123a connected to the first slave chip 110a. Here, the first fuse signal FD 1 has address information on a defective die of the first slave chip 110a. In the same manner, the second fuse box 121b provides a second fuse signal FD2 having address information on a defective die of the second slave chip 110b, to the second die selection unit 123b. The third fuse box 121c provides a third fuse signal FD3 having address information on a defective die of the third slave chip 110c, to the third die selection unit 123c. Moreover, the fourth fuse box 121d provides a fourth fuse signal FD4 having address information on a defective die of the fourth slave chip 110d, to the fourth die selection unit 123d.

Figure 13:
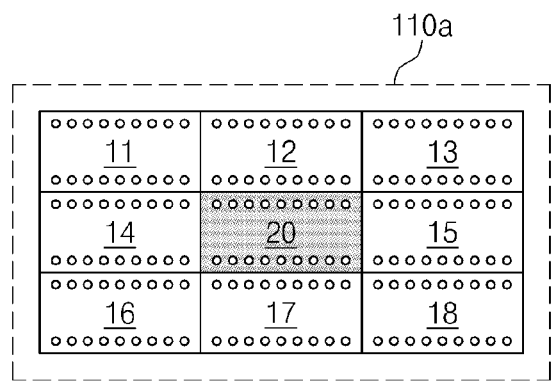
FIG. 13 is a plan view of a slave chip equipped in a semiconductor package according to another embodiment of the inventive concepts.

Referring to FIG. 17, the first die selection unit 123a may be connected to the first to eighth dies 11 to 18 of FIG. 13 and the redundancy die 20 of FIG. 13 equipped in the first slave chip 110a of FIG. 15 via through silicon via. That is, data signals Die1 to Die8 and RDie of the first to eighth dies 11 to 18 of FIG. 13 and the redundancy die 20 of FIG. 13 of the first slave chip 110a of FIG. 15 may be inputted to the first die selection unit 123a.

The first die selection unit 123a outputs data signals outputted from remaining dies, except data signal transmitted from a defective die, in response to the first fuse signal FD1 inputted from the first fuse box 121a of FIG. 16. That is, the input/output circuit 125 may input/output a data signal to eight dies (including a redundancy die) of the first slave chip 110a. For example, in the first slave chip 110a of FIG. 15 having first to eighth dies 11 to 18 of FIG. 13, when a first die is replaced with a die, the first die selection unit 123a provides a data signal outputted from the second to eighth dies and the redundancy die to the input/output circuit 125 in response to the first fuse signal FD1.

Figure 18:
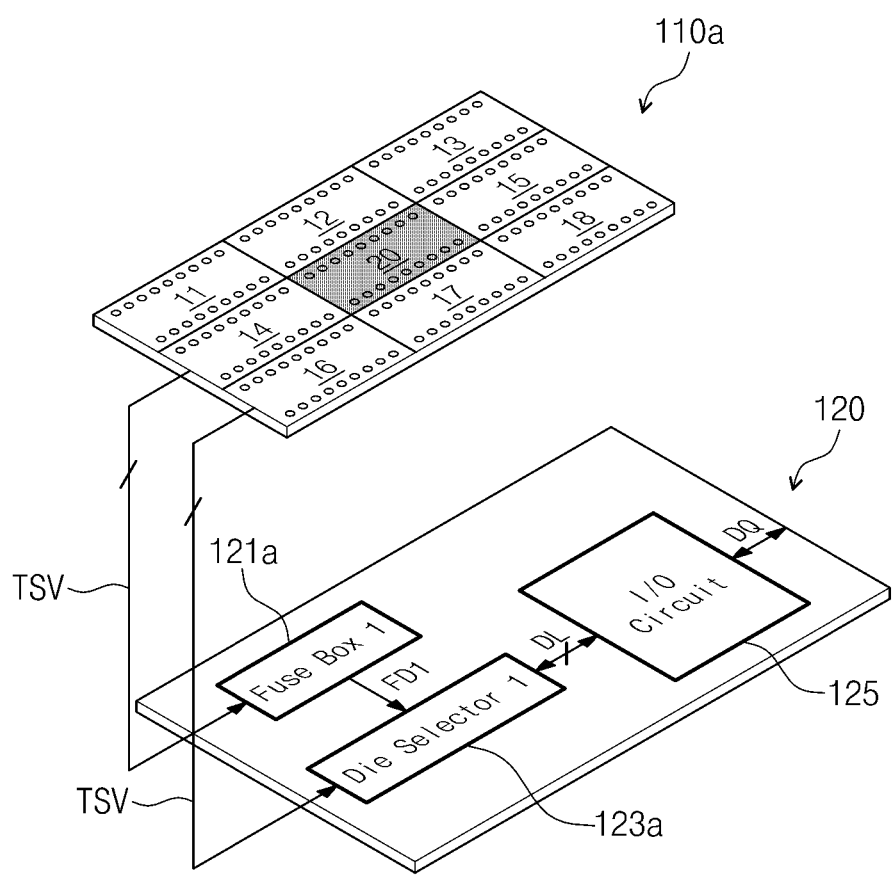
FIG. 18 is a view illustrating an operation of a semiconductor package of FIG. 13, i.e., an operation between a first slave chip and a master chip.

FIG. 18 is a view illustrating an operation of a semiconductor package of FIG. 13, i.e., an operation between a first slave chip and a master chip.

Referring to FIG. 18, when the fifth die 15 is detected as defective during a test process on the first slave chip 11a, the first fuse box 121a cuts off an e-fuse connected to the fifth die 15 to replace it with the redundancy die 20. Also, the first fuse box 121a sends a first fuse signal FD1 having address information on the fifth die 15 to the first die selection unit 123a. Accordingly, the first die selection unit 123a provides data signals outputted from the first to fourth and sixth to eighth dies 11, 12, 13, 14, 16, 17, and 18 and the redundancy die 20 of the first slave chip 110a in response to the first fuse signal FD1, to the input/output circuit 125. In the same manner, such an operation between the second to fourth slave chips 110b to 110d of FIG. 15 and the master chip 120 may be performed, and the input/output circuit 125 selects one of the plurality of die selection units 123a to 123d of FIG. 15 to input/output data to one of the first to fourth slave chips 110b to 110d of FIG. 15.

Figure 19:
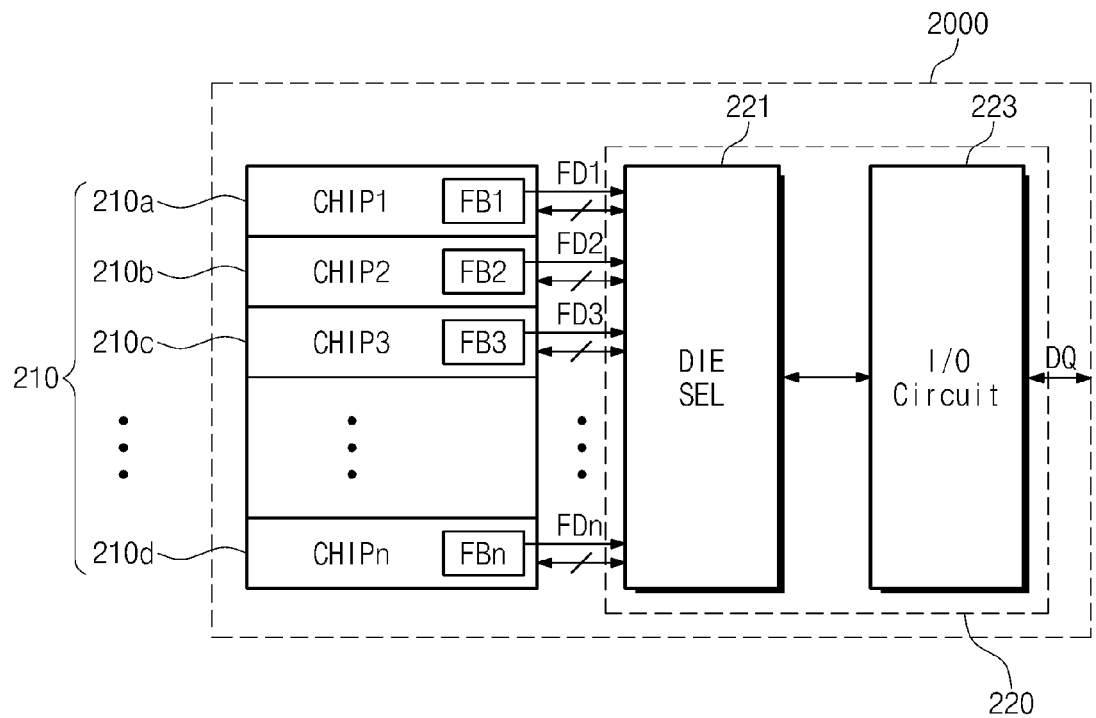
FIG. 19 is a block diagram of a semiconductor package according to another embodiment of the inventive concepts.
Figure 20:
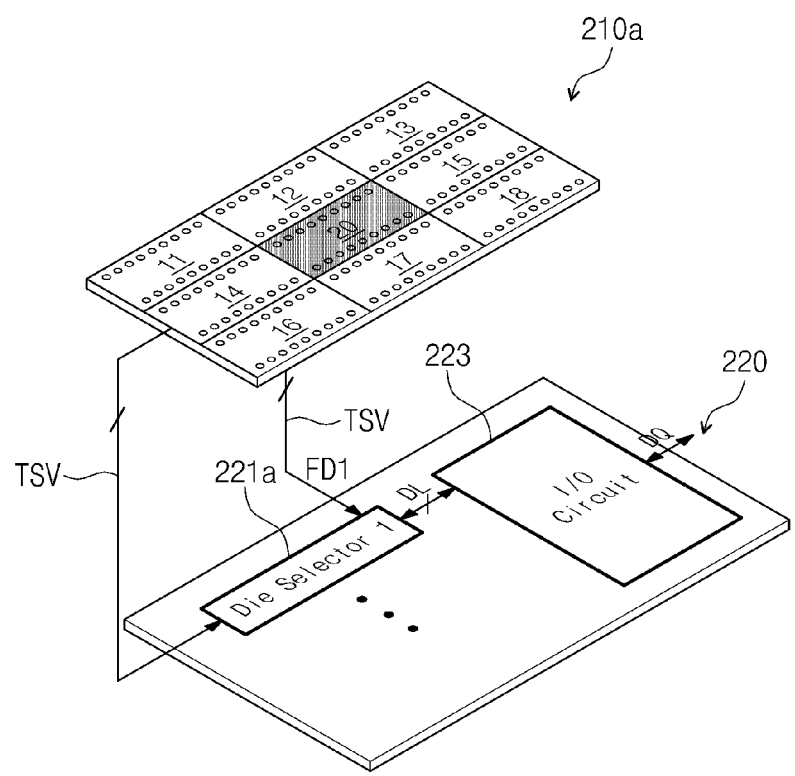
FIG. 20 is a view illustrating an operation of a semiconductor package of FIG. 19, i.e., an operation between a first slave and a master chip.

FIG. 19 is a block diagram of a semiconductor package according to another embodiment of the inventive concepts. FIG. 20 is a view illustrating an operation of a semiconductor package of FIG. 19, i.e., an operation between a first slave and a master chip.

Referring to FIG. 19, the semiconductor package 2000 includes a stack semiconductor chip 210 and a master chip 220 including a die selection circuit 221 and an input/output circuit 223.

The stack semiconductor chip 210 includes a plurality of slave chips 210a to 210d as described with reference to FIGS. 13 and 14. Also, as shown in FIG. 20, each of the slave chips 210a to 210d may include a plurality of dies 11 to 18 and a redundancy die 20, and the slave chips 210a to 210d may be connected to the die selection circuit 221. For example, the die selection circuit 221 may include a first die selection unit 221a connected to the first slave chip 210a, a second die selection unit 221b connected to the second slave chip 110b, a third die selection unit 221c connected to the third slave chip 210c, and a fourth die selection unit 221d connected to the fourth slave chip 210d.

In this embodiment, the slave chips 210a to 210d may include fuse boxes FB1, FB2, FB3, . . . , FBn, respectively, and accordingly, a fuse signal FD having address information on a defective die of each of the slave chips 210a to 210d may be provided from the stack semiconductor chip 210 to the master chip 220. Furthermore, the fuse boxes FB1, FB2, FB3, . . . , FBn respectively equipped in the slave chips 210a to 210d may include e-fuses connected to dies, respectively.

That is, the first slave chip 210a includes the first fuse box FB1, and the first fuse box FB1 outputs a first fuse signal FD1 having address information on a defective die of the first slave chip 210a, to the die selection circuit 221. The second slave chip 210b includes the second fuse box FB2, and the second fuse box FB2 outputs a second fuse signal FD2 having address information on a defective die of the second slave chip 210b, to the die selection circuit 221. The third slave chip 210c includes the third fuse box FB3, and the third fuse box FB3 outputs a third fuse signal FD3 having address information on a defective die of the third slave chip 210c, to the die selection circuit 221. In the same manner, the fourth slave chip 210d includes the fourth fuse box FB4, and the fourth fuse box FB4 outputs a fourth fuse signal FD4 having address information on a defective die of the fourth slave chip 210d, to the die selection circuit 221.

Referring to FIG. 20, when the fifth die 15 is detected as a defective die during a test process on the first slave chip 210a, the first fuse box FB1 of FIG. 19 of the first slave chip 210a replaces the fifth die 15 with the redundancy die 20, and provides a first fuse signal FD1 having address information on the fifth die 15 to the first die selection unit 221a of the master chip 220. Accordingly, the first die selection unit 221a provides data signals outputted from the first to fourth and sixth to eighth dies 11, 12, 13, 14, 16, 17, and 18 and the redundancy die 20 of the first slave chip 210a, to the input/output circuit 123 in response to the first fuse signal FD1.

Figure 21:
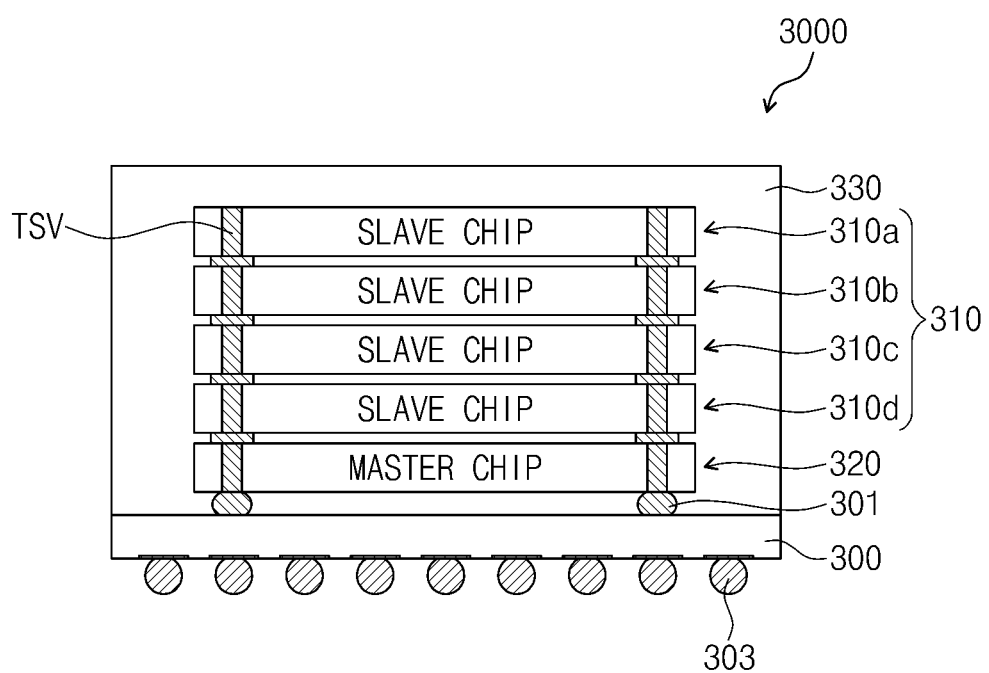
FIG. 21 is a sectional view of a semiconductor package according to another embodiment of the inventive concepts.
Figure 22:
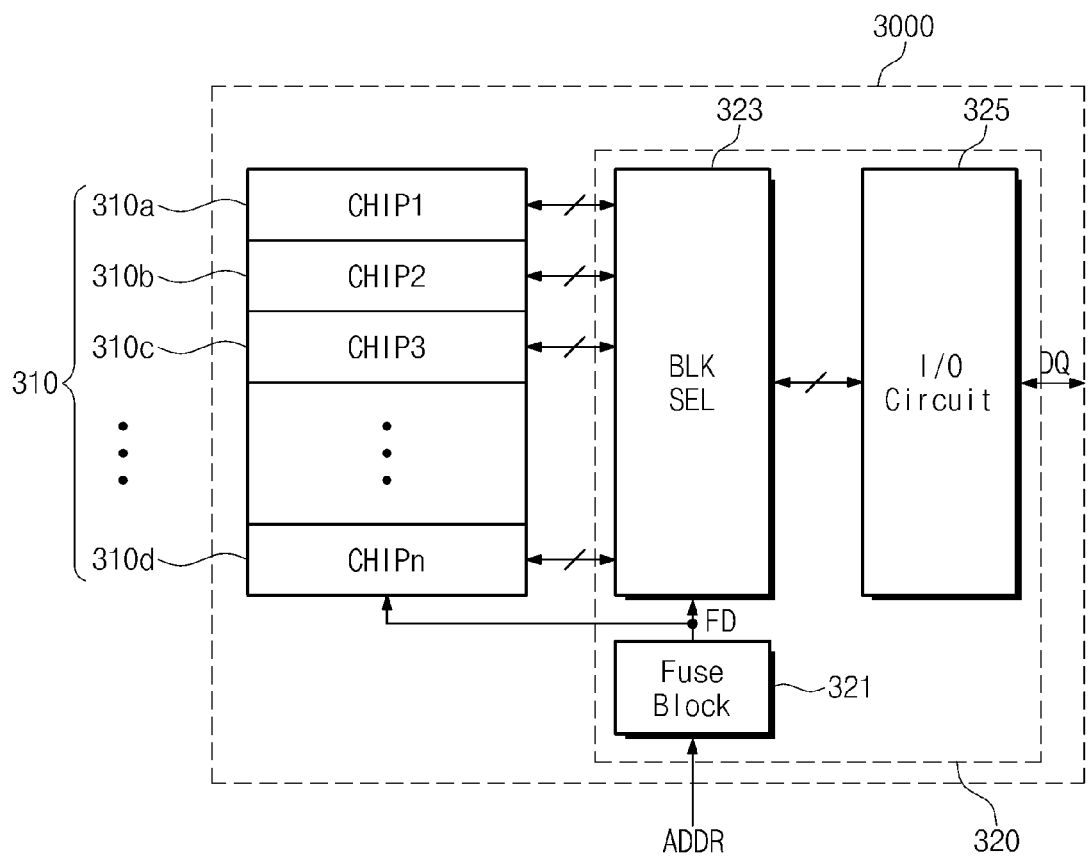
FIG. 22 is a block diagram of a semiconductor package according another embodiment of the inventive concepts.
Figure 23:
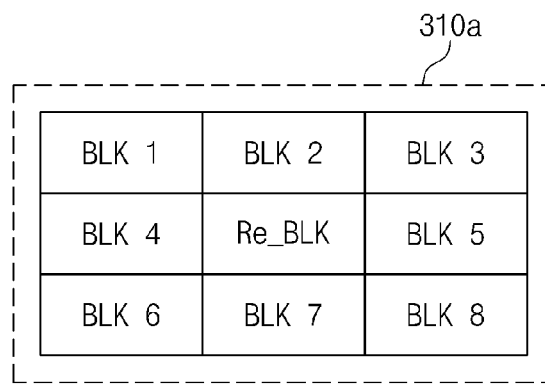
FIG. 23 is a plan view of a slave chip equipped in a semiconductor package according to another embodiment of the inventive concepts.

Referring to FIGS. 21 to 23, a semiconductor package according to another embodiment of the inventive concepts will be described in more detail.

FIG. 21 is a sectional view of a semiconductor package according to another embodiment of the inventive concepts. FIG. 22 is a block diagram of a semiconductor package according another embodiment of the inventive concepts. FIG. 23 is a plan view of a slave chip equipped in a semiconductor package according to another embodiment of the inventive concepts.

Referring to FIGS. 21 and 22, a semiconductor package 3000 includes a master chip 320 having an input/output circuit and a stack semiconductor chip 310 stacked on the master chip 320. The master chip 320 may be mounted on the package substrate 300, and may have through silicon via TSV.

In this embodiment, the stack semiconductor chip 310 includes a plurality of stacked slave chips 310a to 310d, and the stacked slave chips 310a to 310d may be connected to the master chip 320 via through silicon via TSV.

Each of the slave chips 310a to 310d may be configured with one die. One die includes a data input/output buffer and a memory cell array to operate separately. According to this embodiment, as shown in FIG. 23, each of the slave chips 310a to 310d includes a plurality of memory blocks BLK1 to BLK8 and a redundancy block Re_BLK. The memory blocks BLK1 to BLK8 and the redundancy block Re_BLK include a memory cell array having a plurality of memory cells.

According to this embodiment, after the stack semiconductor chip 310 is formed by stacking the slave chips 310a to 310d including the memory blocks BLK1 to BLK8 and the redundancy block Re_BLK, a defective memory block may be detected through a test process on each of the salve chips 310a to 310d. Then, a defective memory block is repaired with the redundancy block Re_BLK in each of the slave chips 310a to 310d.

The master chip 320 includes a fuse block 321, a block selection circuit 323, and an input/output circuit 325. Then, the master chips 320 includes a chip selection circuit (not shown) selecting the slave chips 310a to 310d and a cell array.

The fuse block 321 repairs a defective memory block of each of the salve chips 310a to 310d with the redundancy block Re_BLK in response to an address signal ADDR, and transmits a fuse signal FD, which is generated based on whether a fuse is cut off, to the block selection circuit 323.

The block selection circuit 323 connects the remaining memory blocks except a defective memory block and the redundancy block Re_BLK in each of the slave chips 310a to 310d to the input/output circuit 325. The block selection circuit 323 may include block selection units (not shown)

corresponding, respectively, to each of the stacked slave chips 310a to 310d, for example, in the same manner discussed above with respect to the die selection circuit 123 described with reference to FIGS. 15 and 17. Additionally, like the die selection unit 123a described with reference to FIG. 17, each of the block selection units (not shown) provides data signals outputted from the remaining memory blocks except a defective memory block and a redundancy block, to the input/output circuit 325. The input/output circuit 325 inputs/outputs data from the slave chips 110 to an external device.

Figure 24:
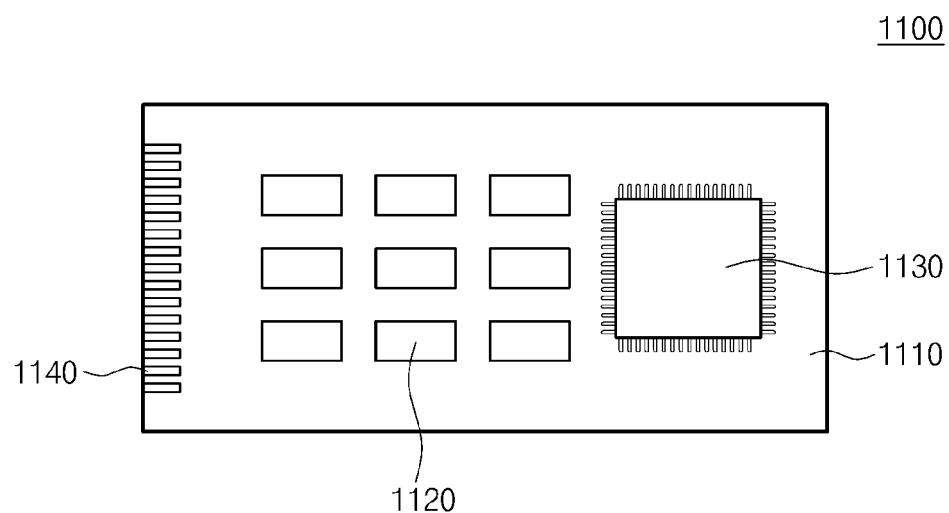
FIG. 24 is a view of a package module including a semiconductor package according to an embodiment of the inventive concepts.

FIG. 24 is a view of a package module including a semiconductor package according to an embodiment of the inventive concepts.

Referring to FIG. 24, a package module 1100 may be provided in a form such as a semiconductor integrated circuit chip 1120 and a quad flat package (QFP) semiconductor integrated circuit chip 1130. Since the semiconductor integrated circuit chips 1120 and 1130 to which a semiconductor chip package technique according to an embodiment of the inventive concepts is applied are installed at the substrate 1110, the package module 1100 may be formed. The package module 1100 may be connected to an external electronic device through an external connection terminal 1140 disposed at one side of the substrate 1110.

Figure 25:
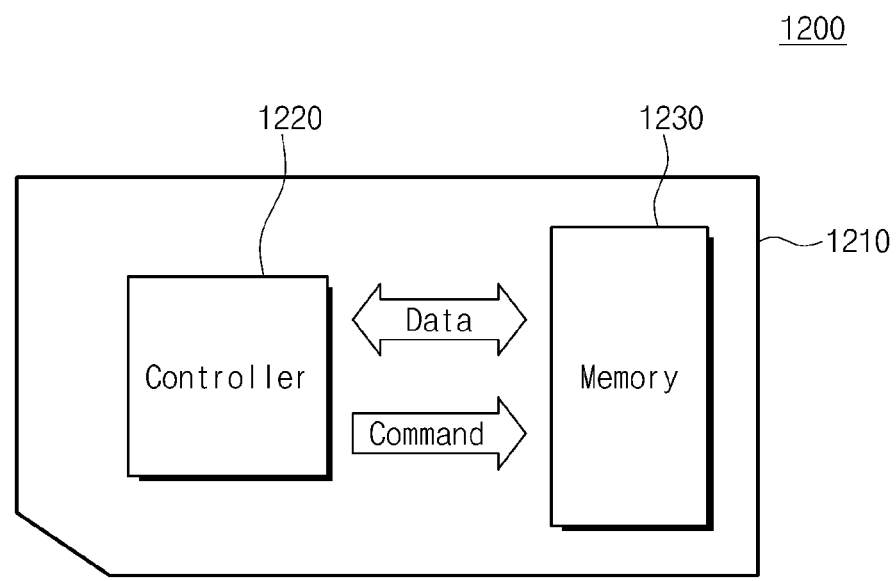
FIG. 25 is a view of a memory card including a semiconductor package according to an embodiment of the inventive concepts.

FIG. 25 is a view of a memory card including a semiconductor package according to an embodiment of the inventive concepts.

Referring to FIG. 25, the memory card 1200 includes a controller 1220 and a memory 1230 in a housing 1210. The controller 1220 and the memory 1230 may exchange an electrical signal. For example, in response to a command of the controller 1220, the memory 1230 and the controller 1220 may exchange data. Accordingly, the memory card 1200 may store data in the memory 1230, or may output data from the memory 1230 to the outside.

The controller 1220 and/or the memory 1230 may include at least one semiconductor package according to any one of the embodiments of the inventive concepts discussed above with reference to FIGS. 1-24. The memory card 1200 may be used for data storage media of various portable devices. For example, the memory card 1200 may include a multimedia card (MMC) or a secure digital (SD) card.

Figure 26:
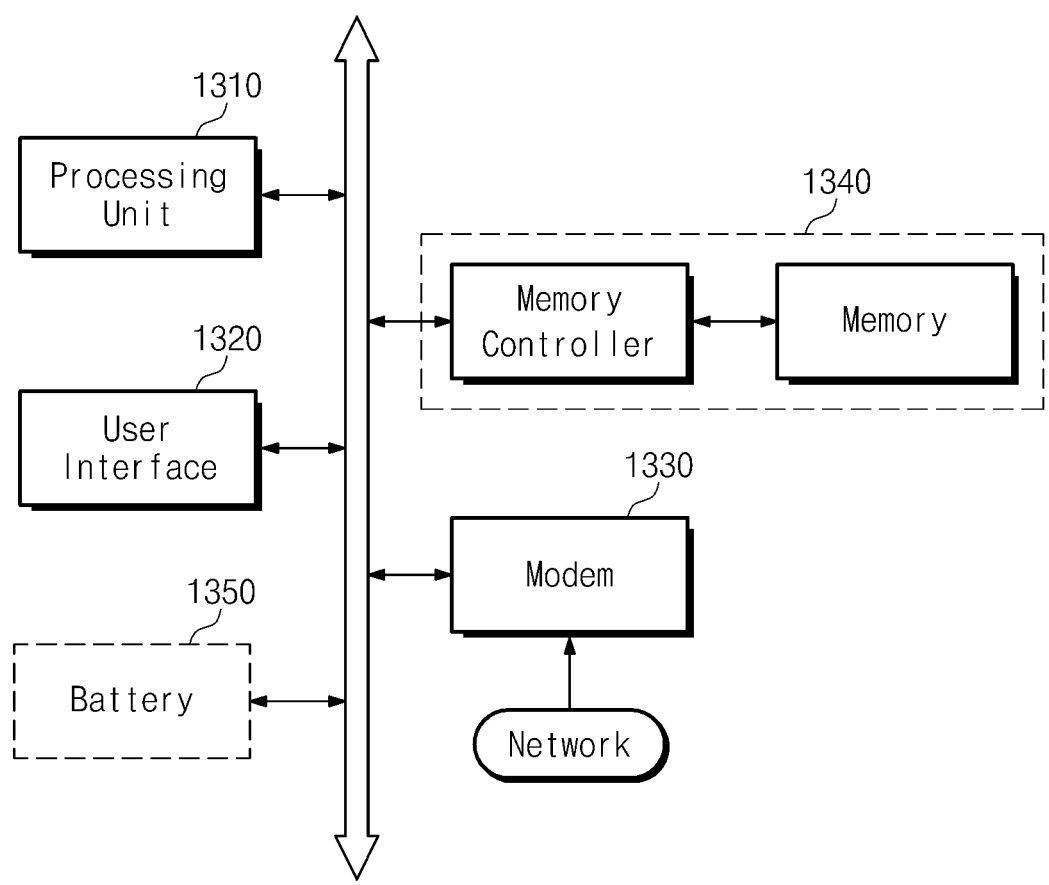
FIG. 26 is a block diagram of an electronic system including a semiconductor package according to an embodiment of the inventive concepts.

FIG. 26 is a block diagram of an electronic system including a semiconductor package according to an embodiment of the inventive concepts.

Referring to FIG. 26, the electronic system 1300 may include at least one of semiconductor package according to any one of the embodiments of the inventive concepts discussed above with reference to FIGS. 1-24. The electronic system 1300 may include a mobile device or a computer. For example, the electronic system 1300 may include a processor 1310, a user interface 1320, a memory system 1340, and a modem 1330 such as a baseband chipset, which may communicate with each other through a bus. The processor 1310 serves to execute a program and control the electronic system 1300. For example, the processor 1310 may include at least one semiconductor package according to any one of the embodiments of the inventive concepts discussed above with reference to FIGS. 1-24. The user interface 1320 may be used to input/output data to the electronic system 1300. The memory system 1340 may store codes for an operation of the processor 1310, data processed by the processor 1310, or data inputted from the outside. The memory system 1340 may include a controller and a memory, and also may include at least one semiconductor package according to any one of the embodiments of the inventive concepts discussed above with reference to FIGS. 1-24.

The electronic system 1300 may be implemented with a mobile system, a personal computer, an industrial computer, or a logic system performing various functions. When an electronic system according to an embodiment of the inventive concepts is a mobile system, a battery for supplying an operating voltage of an electronic device may be additionally provided. For example, the mobile system may be one of a personal digital assistant (PDA), a portable computer, a web tablet, a mobile phone, a wireless phone, a laptop computer, a memory card, a digital music system, and an information transmitting/receiving system. When the electronic system 1300 is wireless communication equipment, it may use a communication interface protocol of a third generation communication system such as CDMA, GSM, NADC, E-TDMA, WCDMA, and CDMA2000.

Figure 27:
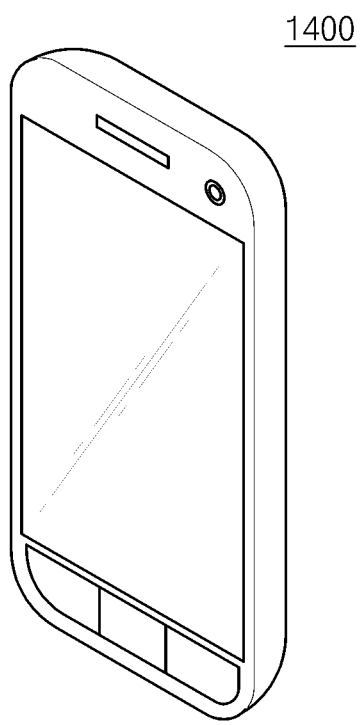
FIG. 27 is a view illustrating an electronic device including an applied semiconductor package according to an embodiment of the inventive concepts.

FIG. 27 is a view illustrating an electronic device including an applied semiconductor package according to an embodiment of the inventive concepts.

Referring to FIG. 27, a mobile phone 1400 is shown as an electronic device including an applied semiconductor package according to an embodiment of the inventive concepts. As another example, a semiconductor package according to at least some embodiments of the inventive concepts may be applied to a smart phone, a PDA, a portable multimedia player (PMP), a digital multimedia broadcast (DMB) device, a global positioning system (GPS) system, a handheld gaming console, a portable computer, a web tablet, a wireless phone, a digital music player, or all devices transmitting/receiving information in a wireless environment.

According to At least some embodiments of the inventive concepts, after semiconductor chips (or wafers) including a plurality of dies and a redundancy die are stacked, it is possible to repair a defective die with a redundancy die by each semiconductor chip. Accordingly, the yield of a high capacity semiconductor package may be improved.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A semiconductor package comprising:
first and second slave chips stacked vertically; and
a master chip connected to the first and second slave chips,
each of the first and second slave chips including,
a plurality of memory blocks, the memory blocks arranged along first and second directions perpendicular to each other, and
a redundancy block, the redundancy block disposed between the memory blocks which are adjacent to each other in the first direction and between the memory blocks which are adjacent to each other in the second direction, and
the master chip including,
a fuse block configured to repair a defective memory block detected from the first slave chip and a defective memory block detected from the second slave chip by using the redundancy block of the first slave chip and the redundancy block of the second slave chip, respectively, and a block selection circuit configured to connect the redundancy block of the first slave chip, the redundancy block of the second slave chip, one or more non-defective ones of the plurality of memory blocks of the first slave chip, and one or more non-defective ones of the plurality of memory blocks of the second slave chip to an input/output circuit.

2. The semiconductor package of claim 1, wherein the fuse block comprises:
   a first fuse box configured to output a first fuse signal including information indicating an address of the defective memory block of the first slave chip; and
   a second fuse box configured to output a second fuse signal including information indicating an address of the defective memory block of the second slave chip.

3. The semiconductor package of claim 2, wherein the block selection circuit comprises:
   a first block selection unit configured to connect the redundancy block of the first slave chip and the one or more non-defective memory blocks of the first slave chip to the input/output circuit in response to the first fuse signal; and
   a second block selection unit configured to connect the redundancy block of the second slave chip and the one or more non-defective memory blocks of the second slave chip to the input/output circuit in response to the second fuse signal.

4. The semiconductor package of claim 1, wherein the fuse block is configured to cut off power supply to the defective memory blocks of each of the first and second memory blocks, respectively.

5. The semiconductor package of claim 1, wherein the block selection circuit is connected to input/output lines of the plurality of memory blocks and the redundancy block of the first and second slave chips via one or more through silicon vias.

6. The semiconductor package of claim 1, wherein a first block from among the one or more non-defective memory blocks of the second slave chip is stacked on the defective memory block of the first slave chip, so that the first memory block of the second slave chip is connected to the defective memory block of the first slave chip.

7. The semiconductor package of claim 1, wherein the plurality of memory blocks and the redundant memory blocks of the first slave chip are electrically separated from each other, and the plurality of memory blocks and the redundant memory blocks of the second slave chip are electrically separated from each other.

8. A semiconductor package comprising:
   a plurality of slave chips stacked vertically, each of the plurality of slave chips including,
      a plurality of first memory units, each of the first memory unit including first through silicon vias, and
      a redundancy memory unit including second through silicon vias; and
   a master chip connected to the plurality of slave chips via the first and the second through silicon vias, the master chip including a fuse unit configured to repair a defective memory unit detected from each of the plurality of slave chips by using the redundancy unit of each of the plurality of slave chips,
   wherein the memory units are arranged along first and second directions perpendicular to each other, and
   the redundancy unit is disposed between the memory units which are adjacent to each other in the first direction and between the memory units which are adjacent to each other in the second direction.

* * * * *